US010003341B1

(12) United States Patent
Mauer

(10) Patent No.: US 10,003,341 B1
(45) Date of Patent: Jun. 19, 2018

(54) FLEXIBLE INPUT STRUCTURE FOR ARITHMETIC PROCESSING BLOCK

(71) Applicant: Altera Corporation, San Jose, CA (US)

(72) Inventor: Volker Mauer, Princes Risborough (GB)

(73) Assignee: Altera Corporation, San Jose, CA (US)

( * ) Notice: Subject to any disclaimer, the term of this patent is extended or adjusted under 35 U.S.C. 154(b) by 134 days.

(21) Appl. No.: 15/201,815

(22) Filed: Jul. 5, 2016

Related U.S. Application Data

(63) Continuation of application No. 12/495,382, filed on Jun. 30, 2009, now abandoned.

(51) Int. Cl.
*H03K 19/20* (2006.01)
*G06F 7/50* (2006.01)
*G06F 7/544* (2006.01)
*G06F 7/523* (2006.01)

(52) U.S. Cl.
CPC ............ *H03K 19/20* (2013.01); *G06F 7/50* (2013.01); *G06F 7/523* (2013.01); *G06F 7/5443* (2013.01)

(58) Field of Classification Search
CPC .......... G06F 7/5443; G06F 7/57–7/575; G06F 17/505–17/5054
See application file for complete search history.

(56) References Cited

U.S. PATENT DOCUMENTS

| 5,513,133 | A | 4/1996 | Cressel et al. |
| 5,668,749 | A | 9/1997 | Corleto et al. |
| 6,222,757 | B1 * | 4/2001 | Rau ............... H03K 19/1776 365/154 |
| 6,324,561 | B1 * | 11/2001 | Cambonie ......... G06F 17/142 708/406 |
| 6,781,408 | B1 * | 8/2004 | Langhammer ... H03K 19/17732 326/38 |
| 7,230,451 | B1 | 6/2007 | Langhammer |
| 7,428,563 | B2 | 9/2008 | Eo et al. |
| 7,949,699 | B1 | 5/2011 | Neoh et al. |
| 8,090,758 | B1 * | 1/2012 | Shimanek ....... H03K 19/17728 708/501 |
| 2002/0099747 | A1 | 7/2002 | Timko et al. |
| 2005/0144215 | A1 * | 6/2005 | Simkins ............. G06F 7/5443 708/620 |
| 2006/0179092 | A1 | 8/2006 | Schmookler |
| 2006/0190516 | A1 * | 8/2006 | Simkins ................. G06F 7/02 708/490 |
| 2006/0230095 | A1 | 10/2006 | Simkins et al. |
| 2008/0046494 | A1 | 2/2008 | Curtis et al. |
| 2010/0191786 | A1 | 7/2010 | Simkins et al. |
| 2010/0192118 | A1 | 7/2010 | Wendling et al. |

OTHER PUBLICATIONS

Kreuger, "Virtex-EM FIR Filter from Video Applications", Mar. 14, 2000.
Atmel FPGA Digital Filter Application Note, pp. 1-2.

(Continued)

*Primary Examiner* — Matthew Sandifer

(57) ABSTRACT

An arithmetic processing block in which two inputs are provided for a multiplier, the block also including a pre-adder for combining the inputs to provide an additional option for a multiplier input.

19 Claims, 4 Drawing Sheets

(56) References Cited

OTHER PUBLICATIONS

Erdogan, A.T. et al., "Architectural trade-offs in the design of low power FIR filtering cores," IEE Proc.-Circuits Devices Syst., Feb. 2004, vol. 151, No. 1, pp. 10-17.
Moller, Finn et al., "Algorithm and Architecture of a 1V Low Power Hearing Instrument DSP," Low Power Electronics and Design, International Symposium, 1999, pp. 7-11.
"TMS320C54x DSP Reference Set, vol. 4: Application Guide," Texas Instruments, Oct. 1996 (373 pages).
Stratix Device Handbook, vol. 1 (Figure 7-31. Details on Implementation of Symmetric 3×3 Convolution Filter Block).

\* cited by examiner

US 10,003,341 B1

FLEXIBLE INPUT STRUCTURE FOR ARITHMETIC PROCESSING BLOCK

This application is a continuation of U.S. patent application Ser. No. 12/495,382, filed Jun. 30, 2009, which is hereby incorporated by reference herein in its entirety.

BACKGROUND

The invention relates to data processing hardware that is reconfigurable to perform different operations.

FIG. 1 illustrates a half of a digital signal processing (DSP) block in a Stratix® II field programmable gate array (FPGA) device from Altera Corporation of San Jose, Calif. The part-block 10 shown in FIG. 1 has four input paths 12 to 18 and three output paths 20 to 24. The part-block 10 also comprises two multipliers 26 and 28 and an adder 30. Optional input registers 12a to 18a are shown in the diagram, but optional pipelining and output registers have not been shown. Multiplier 26 multiplies together the values received on input paths 12 and 14 and provides the result on output path 20. Likewise, multiplier 28 multiplies together the values received on input paths 16 and 18 and provides the result on output path 24. The values conveyed on the output paths 20 and 24 are also provided as inputs to the adder 30 by paths 32 and 34, respectively. The adder 30 can be configured in known fashion to either add its inputs together or to subtract the value received on path 34 from the value received on path 32. The adder 30 also includes functionality to enable it to perform summation or accumulation of additions/subtractions performed over successive clock cycles. The output of the adder 30 is provided on output path 22.

It is commonly desired in DSP routines to perform an addition prior to multiplication. That is to say, to perform a calculation of the type (A+B)×C. One option for catering for that kind of operation is to adapt the structure shown in FIG. 1 to include one or more additional adders in front of the multipliers 26 and 28 but this has the consequence of requiring additional input paths to the part-block 10 which would undesirably increase the amount of silicon area taken up by the part-block.

SUMMARY

According to one aspect, an embodiment of the invention provides an arithmetic processing block including first and second block inputs for receiving block input values on which arithmetic operations are to be performed, a first multiplier arranged to multiply together values received on first and second multiplier inputs to deliver a multiplier output value on a first multiplier output, a first adder arranged to combine together two block input values from respective ones of the first and second block inputs to produce an adder output value on a first adder output, a first multiplexer arranged to connect to the first multiplier input one of a first group of connections including the first block input and the first adder output, and a second multiplexer arranged to connect to the second multiplier input one of a second group of connections including the second block input and the first adder output.

Thus, an arithmetic block is provided that is capable of performing addition ahead of multiplication without necessarily adding additional, area-consuming inputs to the block. The addition can be performed by a structure that makes only a relatively small increase to the silicon area of the block. The arithmetic block is flexible in that the adder output can be routed to either or both of the first and second multiplier inputs.

According to another aspect, an embodiment of the invention provides an arithmetic processing block having two block inputs intended for feeding two multiplier inputs of a multiplier. The arithmetic processing block includes a pre-adder block capable of performing a group of functions. The pre-adder block includes a pre-adder. The arithmetic processing block further includes a controller for selecting which one of the group of functions the pre-adder block is to perform at a given time. The group of functions includes a first function including feeding the multiplier inputs with values from respective ones of the block inputs and a second function including feeding one of the multiplier inputs with the result of combining in the pre-adder values from respective ones of the block inputs.

One or more adders, or pre-adders, used in embodiments of the invention may, in certain circumstances, be operated to perform subtraction.

An arithmetic processing block according to an embodiment of the invention may be part of an aggregation of such blocks forming a larger block or area in a device.

An arithmetic processing block according to an embodiment of the invention may be implemented in, for example, an FPGA or an application specific integrated circuit.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use embodiments of the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
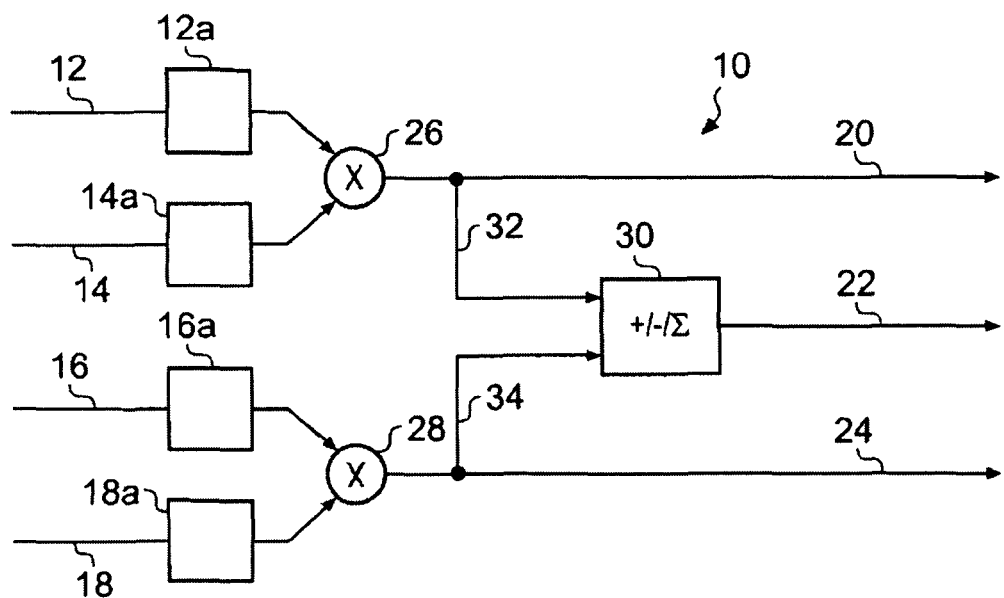
FIG. 1 is a block diagram schematically illustrating a part of a prior art DSP block within an FPGA device.
Figure 2:
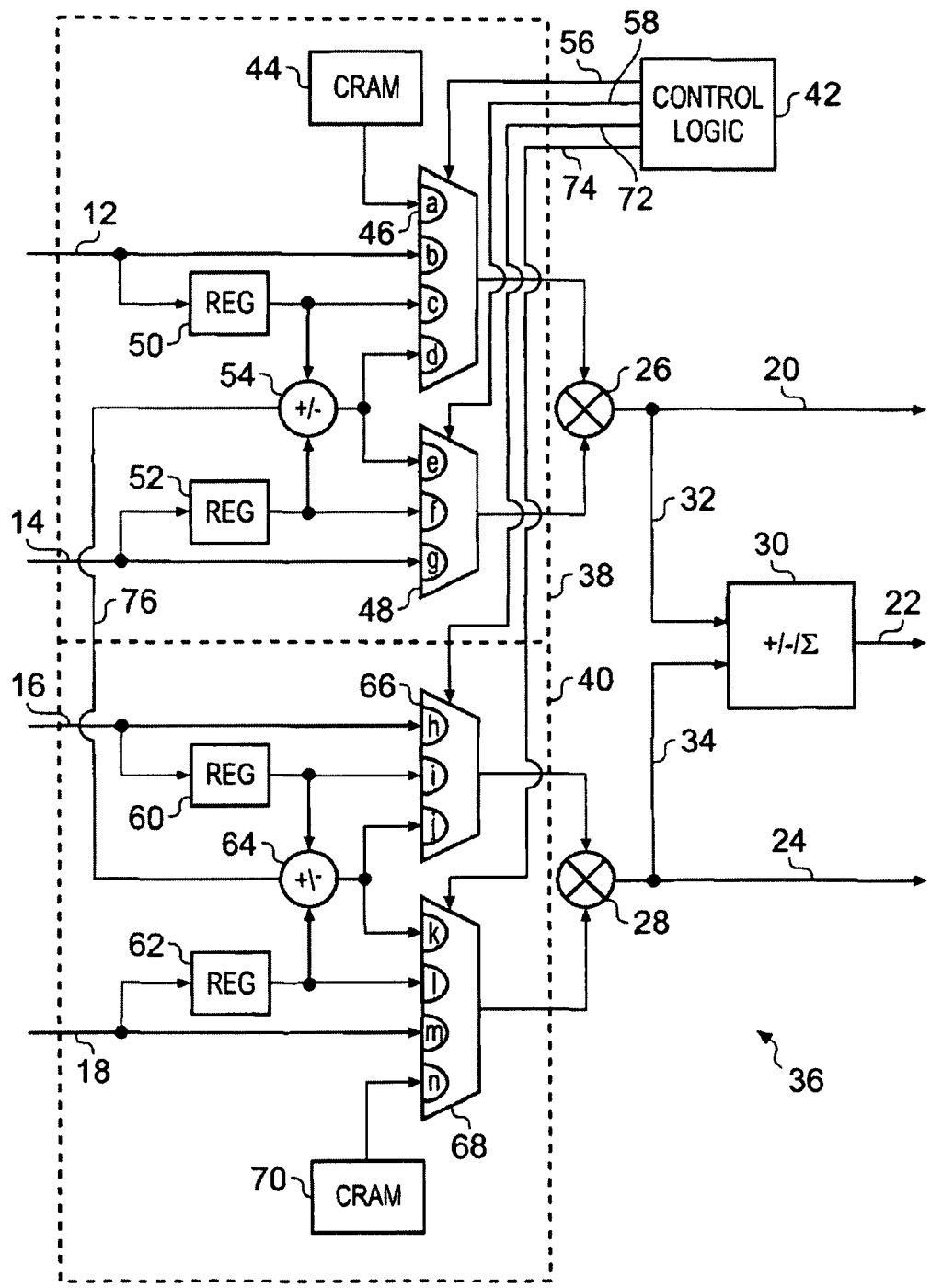
FIG. 2 is a block diagram schematically illustrating an embodiment of a part of a DSP block of the present invention within an FPGA device.

FIG. 2 shows a modified version of the part-block 10 of FIG. 1. In FIG. 2, elements retained from FIG. 1 retain the same reference numerals and, for the sake of brevity, their function will not be described again here. In general terms, the part-block 36 shown in FIG. 2 is a version of part-block 10 with a selectable pre-adder block (SPAB) 38 interposed between input paths 12 and 14 and multiplier 26 and a SPAB 40 interposed between input paths 16 and 18 and multiplier 28. Furthermore, control logic 42 is provided for controlling the SPABs 38 and 40. The SPABs 38 and 40 are each bounded by a dashed outline and they have the same constitution and function. Therefore, in the interests of expediency, only SPAB 38 will now be described in detail, it being understood that SPAB 40 is fundamentally the same.

The SPAB 38 comprises two multiplexers 46 and 48. Multiplexer 46 has four inputs, which are labelled (a) to (d), and its output is provided to an input of multiplier 26. The control logic 42 applies a control signal to a control port of the multiplexer 46 over path 56 to determine which of the multiplexer's four inputs is passed to its output. Multiplexer 48 has three inputs, which are labelled (e) to (g), and its output is provided to an input of multiplier 26. The control logic 42 applies a control signal to a control port of the multiplexer 48 over path 58 to determine which of the multiplexer's three inputs is passed to its output.

The SPAB 38 also includes two registers 50 and 52, an adder 54 and a configuration random access memory (CRAM) 44. A CRAM, such as that indicated 44, is a memory that can be reprogrammed when the FPGA that contains part-block 36 is not in run-time mode.

The register 50 is loaded from input path 12 and its content is supplied to an input of the adder 54 and to input (c) of the multiplexer 46. Likewise, register 52 is loaded from input path 14 and its content is supplied to an input of the adder 54 and to input (f) of the multiplexer 48. The adder 54 can be reconfigured in known fashion to either sum its inputs or to subtract the value from register 52 from the value from register 50. The result produced by adder 54 is fed in parallel to inputs (d) and (e) of multiplexers 46 and 48, respectively. As to the remaining inputs of multiplexers 46 and 48, input (a) is supplied with a value from CRAM 44, input (b) is supplied with the value on input path 12 and input (g) is supplied with the value on input path 14.

As can be seen in FIG. 2, SPAB 40 is effectively a mirror image of SPAB 38 but operating on input paths 16 and 18 instead. The registers in SPAB 40 are indicated 60 and 62, the adder is indicated 64, the multiplexers are indicated 66 and 68 and the CRAM is indicated 70. The inputs of multiplexer 66 are labelled (h) to (j) and the inputs of multiplexer 68 are labelled (k) to (n). Multiplexers 66 and 68 are controlled by signals from control logic 42 over paths 72 and 74, respectively. A path 76 connects the adders 54 and 64 to allow adder 54 to send a carry bit to adder 60 in certain modes of operation. When a carry bit is not required, path 76 is disabled by means of a switch (not shown) that is controlled by a further CRAM (not shown). Typically, the switch is based on an AND gate.

Various modes of operation of the part-block 36 will now be described.

First of all, it can be observed that all modes of operation of part-block 10 are supported by part-block 36. This can be achieved by selecting multiplexer outputs (c), (f), (i) and (l). Optionally, the input registers 50, 52, 60 and 62 can be bypassed by selecting instead multiplexer inputs (b), (g), (h) and (m). When the input registers 50, 52, 60 and 62 are bypassed, the part-block 36 operates with reduced latency.

The part-block 36 can be configured to perform a squared difference calculation of the form $(A-B)^2$. In this mode, the adders 54 and 64 are operated as subtractors and the multiplexer inputs (d), (e), (j) and (k) are selected. Accordingly, the value on path 20 will then be the square of the difference between the values presented on paths 12 and 14 and the value on path 24 will be the square of the difference between the values presented on paths 16 and 18. Additionally, with adder 30 operated in addition mode, the value emerging on path 22 will be a sum of squared differences value of the form $$\sum_i (A_i - B_i)^2.$$

The part-block 36 can be configured to operate as an adder tree. In this mode, CRAM 44 is set to provide a value equivalent to decimal 1 to input (a), CRAM 70 is set to provide a value equivalent to decimal 1 to input (n), adders 54, 64 and 30 are configured to perform addition and multiplexer inputs (a), (e), (j) and (n) are selected to feed the multipliers 26 and 28. In this case, the addition of the values from paths 12 and 14 is passed unchanged by multiplier 26 to adder 30 and the addition of the values from paths 16 and 18 is passed unchanged by multiplier 28 to adder 30. As a result, adder 30 supplies on output path 22 the summation of the values presented on input paths 12, 14, 16 and 18.

The part-block 36 can be configured to perform a sum of absolute differences (SAD) calculation of the form $$\sum_i |A_i - B_i|.$$

In this mode, adder 30 is operated to perform addition, adders 54 and 64 are configured to perform subtraction and inputs (a), (e), (j) and (n) are supplied to the outputs of their respective multiplexers 46, 48, 66 and 68. The CRAM 44 is modified in this scenario to store binary representations of decimal 1 and decimal −1 and additional logic (not shown) is provided that uses the sign bit of the output of adder 54 to select the one of these representations that is supplied from the CRAM 44 to input (a). If the sign bit is negative, then decimal −1 is read out of the CRAM 44; otherwise, decimal 1 is read out. CRAM 70 is modified in the same way as, and is controlled in the same fashion as, CRAM 44. Thus, adder 30 sums the moduli that are produced by subtracting adders 54 and 56 to complete the SAD calculation.

There are other ways of arranging the conditional sign inversion of the outputs of subtracting adders 54 and 64 that is required for the SAD calculation. For example, the CRAM 44 could contain just the binary representation of decimal 1 and logic (not shown) could be provided to XOR (exclusive-OR) the sign bit of the output of adder 54 with the output of the CRAM 44 prior to the latter's supply to input (a). Another possibility would be to XOR the sign bit of the output of the adder 54 with itself.

The part-block 36 can be configured to operate as a part of a symmetrical finite impulse response (FIR) filter having n+1 taps (where n is an odd integer) such that the part-block performs a part of a calculation of the form $$\sum_{i=0}^{(n-1)/2} ((s_{j+i} + s_{j+n-i}) \times c_i)$$

where the $c_i$ are the filter coefficients and the $s_j$ is the $j^{th}$ sample in the signal that is undergoing filtering (j is an arbitrary integer). In this mode, CRAM 44 is set to provide $c_0$ to multiplexer input (a) and CRAM 70 is set to provide $c_1$ to multiplexer input (n). Also, $s_j$ and $s_{j+n}$ are supplied on input paths 12 and 14, respectively, and $s_{j+1}$ and $s_{j+n-1}$ are supplied on input paths 16 and 18, respectively. In conjunction, adders 54, 64 and 30 are configured to perform addition and multiplexer inputs (a), (e), (j) and (n) are selected.

The result thus provided on output path 22 is a sum of four product terms belonging to the filtering operation. Typically however, there will be more than four taps in the filter so the result from adder 30 will usually have to be added to the output of the corresponding adder of at least one replica of part-block 36 in order to complete the filter calculation (or adder 30 could be used in accumulation mode and new inputs could be given to the part-block 36 to further the filtering calculation). In a variant of this approach, the CRAMs 44 and 70 could be replaced with memories holding a plurality coefficients, from each of which one coefficient could be selected for application to the respective one of multiplexer inputs (a) and (n). In this way, the symmetrical filter becomes reprogrammable between different sets of tap coefficients.

Figure 3:
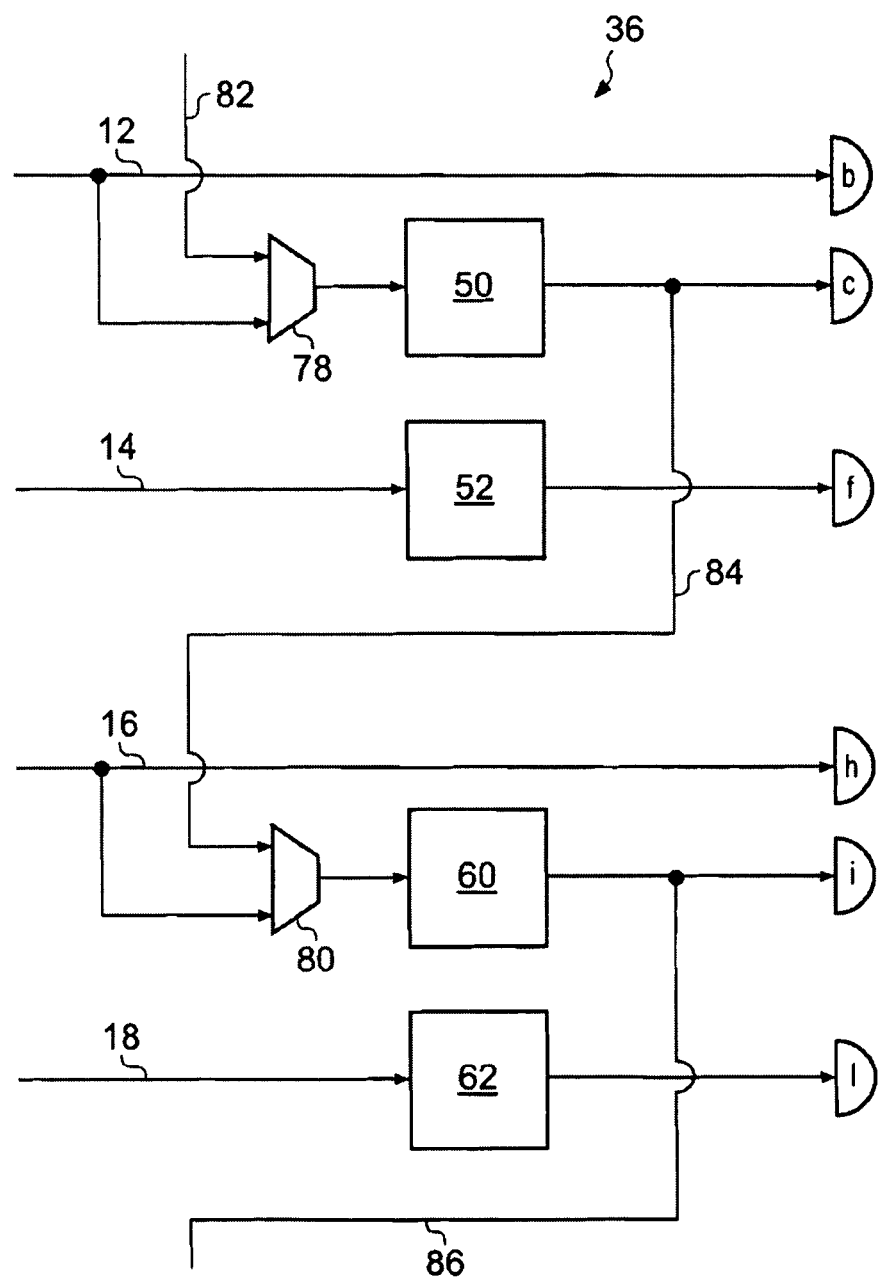
FIG. 3 is a block diagram schematically illustrating a different part of the DSP block that is illustrated in FIG. 2.

FIG. 3 shows certain elements of the part-block 36, which retain the same reference numerals. Also shown in FIG. 3 are some other elements 78 to 86 that exist within an embodiment of the part-block 36 that were not shown in FIG. 2. These newly illustrated elements are multiplexers 78 and 80 and paths 82 to 86. Multiplexer 78 controls whether the value from path 12 or the value from path 82 is loaded into register 50. Similarly, multiplexer 80 controls whether the value from path 16 or the value from path 84 is loaded into register 60. Path 84 brings the output value of register 50 to an input of multiplexer 80. Path 82 provides the option of bringing to multiplexer 78 the output value of the equivalent to register 60 in another part-block. Path 86 provides the option of bringing the output value of register 60 to the equivalent to multiplexer 78 in another part-block.

With the multiplexers 78 and 80 set to load registers 50 and 60 with the values from paths 82 and 84, a shift chain is enabled through the part-block 36 via registers 50 and 60. Using this shift chain, an alternative technique can be provided for configuring the part-block 36 to operate as a part of a symmetrical FIR filter. To do this, multiplexers 46, 48, 66 and 68 are arranged to connect inputs (b), (e), (h) and (k) to their outputs. Assume, as before, that the symmetrical FIR filter being implemented has n+1 taps (where n is an odd integer) such that the part-block performs a part of a calculation of the form $$\sum_{i=0}^{(n-1)/2} ((s_{j+i} + s_{j+n-i}) \times c_i),$$

where the $c_i$ are the filter coefficients and $s_j$ is the $j^{th}$ sample in the signal that is undergoing filtering (j being an arbitrary integer). Coefficients $c_0$ and $c_1$ are supplied on paths 12 and 16 respectively, registers 50 and 60 are loaded with signal samples $s_j$ and $s_{j+1}$ respectively through the aforementioned shift chain, and registers 52 and 62 are loaded with signal samples $s_{j+n}$ and $s_{j+n-1}$ respectively through paths 14 and 18. With the part block 36 thus configured, the result thus provided on output path 22 is a sum of four product terms belonging to the filtering operation. Typically however, there will be more than four taps in the filter so the result from adder 30 will usually have to be added to the output of the corresponding adder of at least one replica of part-block 36 in order to complete the filter calculation.

Figure 4:
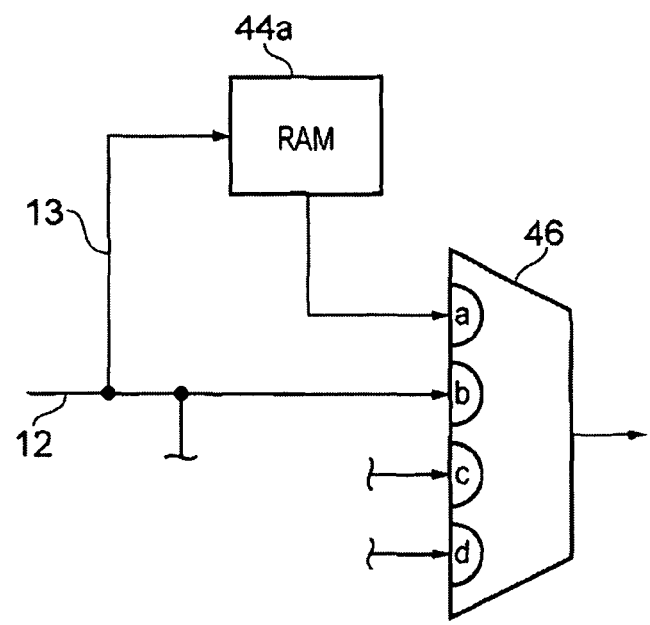
FIG. 4 is a block diagram schematically illustrating a modification that can be made to part of the DSP block that is illustrated in FIG. 2.

A possible modification to the part-block 36 is shown in FIG. 4, which shows only those elements of the part-block 36 that are most closely associated with the modification. As in FIG. 2, FIG. 4 shows multiplexer 46 with input path 12 feeding input (b) of the multiplexer. However, the CRAM feeding input (a) of the multiplexer 46 has been replaced with a random access memory (RAM) 44a that is loaded from input path 12 via loading path 13. Thus, the value presented to input (a) of the multiplexer 46 can be varied as necessary. In a further variant, the path 13 could connect to input path 14 for the purpose of loading the RAM 44a. Of course, similar modifications could be made to any of the other SPABs in the FPGA, e.g., SPAB 40.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An arithmetic processing block comprising:
   first and second block inputs that receive block input values; a first multiplier that multiplies together values received at first and second multiplier inputs to provide a multiplier output value at a first multiplier output, wherein the first and second block inputs are coupled to the first and second inputs respectively;
   a first adder that combines together two block input values from respective ones of the first and second block inputs to produce an adder output value at a first adder output and that is coupled to the first multiplier input;
   a first register that receives the block input values from the first block input, that provides the block input values from the first block input at a first register output, and that is coupled to the first multiplier input, wherein the first adder receives the block input values from the first register output;
   a first multiplexer that receives the first block input, the first adder output, and the first register output as inputs, and selectively connects the first multiplier input to one of said first multiplexer inputs; and
   a multiplexing structure that receives the block input values from the first block input, that receives the output of a second register, and that provides a multiplexing output to the first register, wherein the first and second registers operate as a scan chain when the output of the second register is selected by the multiplexing structure.

2. The arithmetic processing block defined in claim 1, further comprising:
   a second multiplexer that receives the second block input and the first adder output as inputs, and selectively connects the second multiplier input to one of said second multiplexer inputs.

3. The arithmetic processing block defined in claim 2, further comprising:
   a memory having a memory output that provides from the memory, wherein the first multiplexer further receives the memory output.

4. The arithmetic processing block defined in claim 3, wherein the memory is loaded from a selected one of the first and second block inputs.

5. The arithmetic processing block defined in claim 4, wherein the memory is a configuration random access memory.

6. The arithmetic processing block defined in claim 2, further comprising:
a third register that receives block input values from the second block input and providing the block input values from the second block input to a third register output, wherein the second multiplexer further receives the third register output.

7. The arithmetic processing block defined in claim 6, wherein the block input value from the second block input that is used by the first adder is provided from the third register output.

8. The arithmetic processing block defined in claim 7, further comprising:
third and fourth block inputs that receive block input values;
a second multiplier that multiplies together values received at third and fourth multiplier inputs to provide a multiplier output value at a second multiplier output;
a second adder that combines together two block input values from respective ones of the third and fourth block inputs to produce an adder output value at a second adder output; and
a third multiplexer that connects the third multiplier input to one of a third group of connections comprising: the third block input and the second adder output.

9. The arithmetic processing block defined in claim 8, further comprising:
a fourth register that receives the block input values from the third block input and that provides the block input values from the third block input at a fourth register output, wherein the third group of connections further comprises the fourth register output, wherein the second adder receives the block input values from the third block input via the fourth register output; and
an additional multiplexing structure that receives the block input values from the third block input, that receives the first register output, and that provides an additional multiplexing output to the fourth register, wherein the first and fourth registers operate as a scan chain when the output of the first register is selected by the additional multiplexing structure.

10. The arithmetic processing block defined in claim 9, further comprising:
a third adder that combines values received from the first and second multiplier outputs.

11. The arithmetic processing block defined in claim 10, wherein the arithmetic processing block is implemented in a field programmable gate array.

12. An arithmetic processing block comprising:
first and second block inputs that receive first and second sets of block input values respectively;
a first adder circuit that combines two respective block input values of the first and second sets of block input values to produce a first adder output value;
a register that receives the first set of block input values from the first block input and that provides the first set of block input values to the first adder circuit;
a first multiplexer that receives as inputs the first set of block input values from the first block input, the first adder output value from the first adder circuit, and the first set of block input values from the register, and that selects one of said first multiplexer inputs as a first multiplexer output;
a second multiplexer that receives the second set of block input values from the second block input, that receives the adder output value from the first adder circuit, and that produces a second multiplexer output;
a multiplier circuit that receives the first and second multiplexer outputs and that that multiplies together values received from the first and second multiplexer outputs to produce a multiplier output value; and
a second adder that receives the multiplier output value from the multiplier circuit and that produces a second adder output value.

13. The arithmetic processing block defined in claim 12, further comprising: an additional register that receives the second set of block input values from the second block input and that provides the second set of block input values to the first adder and to the second multiplexer.

14. The arithmetic processing block defined in claim 13, further comprising:
a configuration random access memory (CRAM) that provides CRAM values to the first multiplexer.

15. The arithmetic processing block defined in claim 14, further comprising:
a multiplexing structure configured to operate the register to as part of a shift chain in a first configuration by loading the register with data from another register, and configured to load the register with the first block input in a second configuration.

16. The arithmetic processing block defined in claim 13, further comprising:
third and fourth block inputs that receive third and fourth sets of block input values respectively;
a third adder circuit that combines two respective block input values of the third and fourth sets of block input values to produce a third adder output value;
a third multiplexer that receives the third set of block input values from the third block input, that receives the third adder output value from the third adder circuit, and that produces a third multiplexer output
a fourth multiplexer that receives the fourth set of block input values from the fourth block input, that receives the third adder output value from the third adder circuit, and that produces a fourth multiplexer output;
an additional multiplier circuit that receives the third and fourth multiplexer outputs and that multiplies together values received from the third and fourth multiplexer outputs to produce an additional multiplier output value.

17. The arithmetic processing block defined in claim 16, wherein the second adder receives the additional multiplier output value from the multiplier circuit, and wherein the second adder output value is based on a combination of the multiplier output value and the additional multiplier output value.

18. The arithmetic processing block defined in claim 17, wherein the arithmetic processing block is implemented in a field programmable gate array.

19. An arithmetic processing block comprising:
a first block input that receives a first group of block input values; a second block input that receives a second group of block input values; a first multiplier that multiplies together values received at first and second multiplier inputs to provide a multiplier output value at a first multiplier output;
a first adder that combines together two block input values from respective ones of the first and second groups of block inputs to produce an adder output value at a first adder output;

a first register that receives the first group of block input values from the first block input and that provides the first group of block input values to a first register output;

a second register that receives the second group of block input values from the second block input and that provides the second group of block input values to a second register output, wherein the first adder receives the first and second groups of block inputs from the first and second register outputs respectively;

a memory having a memory output through which data is provided from the memory;

a first multiplexer that receives the first block input, the first adder output, the memory output and the first register output as inputs, and selectively connects the first multiplier input to one of said first multiplexer inputs;

a second multiplexer that connects the second multiplier input to one of a second group of connections comprising: the second block input, the first adder output, and the second register output;

a third block input that receives a third group of block input values; a fourth block input that receives a fourth group of block input values; a second multiplier that multiplies together values received at third and fourth multiplier inputs to provide a multiplier output value at a second multiplier output;

a second adder that combines together two block input values from respective ones of the third and fourth groups of block inputs to produce an adder output value at a second adder output; and a third multiplexer that connects the third multiplier input to one of a third group of connections comprising: the third block input and the second adder output.

* * * * *